United States Patent
Moon et al.

(10) Patent No.: US 11,342,344 B2
(45) Date of Patent: May 24, 2022

(54) MEMORY DEVICE AND METHOD OF MANUFACTURING THE SAME

(71) Applicants: Electronics and Telecommunications Research Institute, Daejeon (KR); University-Industry Cooperation Group of Kyung Hee University, Yongin-si (KR)

(72) Inventors: Seungeon Moon, Daejeon (KR); Bae Ho Park, Seoul (KR); Sung-Min Yoon, Suwon-si (KR); Seung Youl Kang, Daejeon (KR); Jeong Hun Kim, Daejeon (KR); Jiyong Woo, Daejeon (KR); Jong Pil Im, Daejeon (KR); Chansoo Yoon, Busan (KR); Ji Hoon Jeon, Seoul (KR)

(73) Assignees: Electronics and Telecommunications Research Institute, Daejeon (KR); University-Industry Cooperation Group of Kyung Hee University, Yongin-si (KR)

( * ) Notice: Subject to any disclaimer, the term of this patent is extended or adjusted under 35 U.S.C. 154(b) by 0 days.

(21) Appl. No.: 17/089,286

(22) Filed: Nov. 4, 2020

(65) Prior Publication Data
US 2021/0134813 A1 May 6, 2021

(30) Foreign Application Priority Data
Nov. 5, 2019 (KR) .................. 10-2019-0140499
May 18, 2020 (KR) .................. 10-2020-0058889

(51) Int. Cl.
*H01L 21/00* (2006.01)
*H01L 27/11507* (2017.01)
(Continued)

(52) U.S. Cl.
CPC .. *H01L 27/11507* (2013.01); *H01L 27/11504* (2013.01); *H01L 28/56* (2013.01); *H01L 28/91* (2013.01); *H01L 28/92* (2013.01)

(58) Field of Classification Search
CPC ......... H01L 27/11507; H01L 27/11504; H01L 28/56; H01L 28/91; H01L 28/92
See application file for complete search history.

(56) References Cited

U.S. PATENT DOCUMENTS 8,278,138 B2    10/2012   Yang et al.
8,980,721 B2    3/2015    Choi
(Continued)

FOREIGN PATENT DOCUMENTS

KR    19980073376 A      11/1998
KR    1020160074594 A    6/2016
KR    101849845 B1       5/2018

OTHER PUBLICATIONS

S. Dünkel et al., "A FeFET based super-low-power ultra-fast embedded NVM technology for 22nm FDSOI and beyond", 2017 IEEE International Electron Devices Meeting (IEDM), Dec. 2-6, 2017.

*Primary Examiner* — Richard A Booth
(74) *Attorney, Agent, or Firm* — Rabin & Berdo, P.C.

(57) ABSTRACT

The present disclosure relates to a memory device, and more particularly, to a memory device including a substrate, a plurality of vertical structures disposed on the substrate and including insulation layers and lower electrodes, which are alternately laminated with each other, wherein the vertical structures are aligned in a first direction parallel to a top surface of the substrate and a second direction crossing the first direction, an upper electrode disposed on a top surface and side surfaces of each of the vertical structures, and a first dielectric layer disposed between the upper electrode and the vertical structures to cover the top surface and the side (Continued)

surfaces of each of the vertical structures. Here, the first dielectric layer includes a ferroelectric material.

16 Claims, 10 Drawing Sheets

(51) Int. Cl.
*H01L 27/11504* (2017.01)
*H01L 49/02* (2006.01)

(56) References Cited

U.S. PATENT DOCUMENTS

| | | |
|---|---|---|
| 9,397,143 B2 | 7/2016 | Rocklein et al. |
| 10,062,425 B2 | 8/2018 | Park et al. |
| 2013/0244016 A1* | 9/2013 | Osada ................. H01L 41/1873 |
| | | 428/220 |
| 2014/0150966 A1* | 6/2014 | Osada .................... H01L 28/56 |
| | | 156/60 |
| 2020/0176552 A1* | 6/2020 | Chang .................... H01L 28/40 |

* cited by examiner

MEMORY DEVICE AND METHOD OF MANUFACTURING THE SAME

CROSS-REFERENCE TO RELATED APPLICATIONS

This U.S. non-provisional patent application claims priority under 35 U.S.C. § 119 of Korean Patent Application No. 10-2019-0140499, filed on Nov. 5, 2019 and Korean Patent Application No. 10-2020-0058889 filed on May 18, 2020 respectively, the entire contents of which are hereby incorporated by reference.

BACKGROUND

The present disclosure herein relates to a memory device, and more particularly, to a memory device having a vertically laminated structure.

As the electronics industry is highly developed, demands for properties of a memory device have gradually increased. For example, the demands for high reliability, high speed, and/or high integrity of the memory device have particularly increased. The memory device may include a non-volatile memory device and a volatile memory device. Although a flash memory device occupies most of market in case of the non-volatile memory device, various researches have been performed to resolve a limitation such as a high write voltage, a slow operation speed, and a short life span.

SUMMARY

The present disclosure provides a memory device having a further improved electrical property.

The present disclosure also provides a memory device having a high integrity.

The object of the present disclosure is not limited to the aforesaid, but other objects not described herein will be clearly understood by those skilled in the art from descriptions below.

An embodiment of the inventive concept provides a memory device including: a substrate; a plurality of vertical structures disposed on the substrate and including insulation layers and lower electrodes, which are alternately laminated with each other, wherein the vertical structures are aligned in a first direction parallel to a top surface of the substrate and a second direction crossing the first direction; an upper electrode disposed on a top surface and side surfaces of each of the vertical structures; and a first dielectric layer disposed between the upper electrode and the vertical structures to cover the top surface and the side surfaces of each of the vertical structures, and the first dielectric layer includes a ferroelectric material.

In an embodiment, the side surfaces of each of the vertical structures may include a first side surface and a second side surface facing the first side surface, and the first dielectric layer may extend from the top surface of each of the vertical structures onto the first side surface and the second side surface and contact the first side surface and the second side surface.

In an embodiment, the upper electrode may include a first portion disposed on the top surface of each of the vertical structures, a second portion connected to the first portion and disposed on the first side surface, and a third portion connected to the first portion and disposed on the second side surface, and the second portion and the third portion may extend parallel to the first side surface and the second side surface, respectively.

In an embodiment, the ferroelectric material may include lead zirconate titanate ($Pb(Zr_{1-y}Ti_y)O_3$), bismuth ferrite ($BiFeO_3$), lead titanate ($PbTiO_3$), hafnium oxide ($HfO_2$), or barium titanate ($BaTiO_3$).

In an embodiment, the memory device may further include a second dielectric layer disposed on the substrate, and the second dielectric layer may extend between a bottom surface of each of the vertical structures and the substrate.

In an embodiment, the top surface of each of the vertical structures may be covered by the first dielectric layer, and the bottom surface of each of the vertical structures may be covered by the second dielectric layer.

In an embodiment, the upper electrode may include a material different from the lower electrode.

In an embodiment, each of the upper electrode and the lower electrodes may include conductive oxide or metal.

In an embodiment, the vertical structure may have a rectangular shape in terms of a plane.

In an embodiment, the upper electrode may cover the first dielectric layer, and the upper electrode may include recessed portions configured to define protruding portions on the substrate.

In an embodiment of the inventive concept, a method of manufacturing a memory device includes: forming a common insulation layer and a first dielectric layer on a substrate in sequence; forming lower electrodes and insulation layers, which are alternately laminated on a top surface of the first dielectric layer; forming vertical structures configured to expose the top surface of the first dielectric layer by performing an etching process on the lower electrodes and the insulation layers; forming a second dielectric layer configured to cover side surfaces of the vertical structures and the top surface of the first dielectric layer; and depositing an upper electrode on a top surface of the second dielectric layer along a top surface profile of the second dielectric layer, and the first dielectric layer includes a ferroelectric material.

In an embodiment, each of the lower electrodes may include one of Cr, Ti, TiN, TaN, TiW, Co, W, LSMO, LCMO, PCMO, $SrRuO_3$, LSCO, ITO, FTO, YBCO, $RuO_2$, and $LaNiO_3$, and the upper electrode may include one of Au, Pt, Pd, Ag, Cu, and Ni.

In an embodiment, the forming of the vertical structures may include forming a first etched portion by removing a portion of each of the insulation layers and the lower electrodes, the etching process may be performed until the top surface of the first dielectric layer is exposed, and the first etched portion may define the vertical structures.

In an embodiment, the depositing of the upper electrode on the top surface of the second dielectric layer along the top surface profile of the second dielectric layer may be performed by using an electron beam deposition method, a thermal vapor method, a laser deposition method, a sputtering deposition method, a chemical vapor deposition method, or a molecular layer deposition method.

In an embodiment, the ferroelectric material may include lead zirconate titanate ($Pb(Zr_{1-y}Ti_y)O_3$), bismuth ferrite ($BiFeO_3$), lead titanate ($PbTiO_3$), hafnium oxide ($HfO_2$), or barium titanate ($BaTiO_3$).

In an embodiment, the method may further include performing a heat treatment process on the upper electrode after the depositing of the upper electrode.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
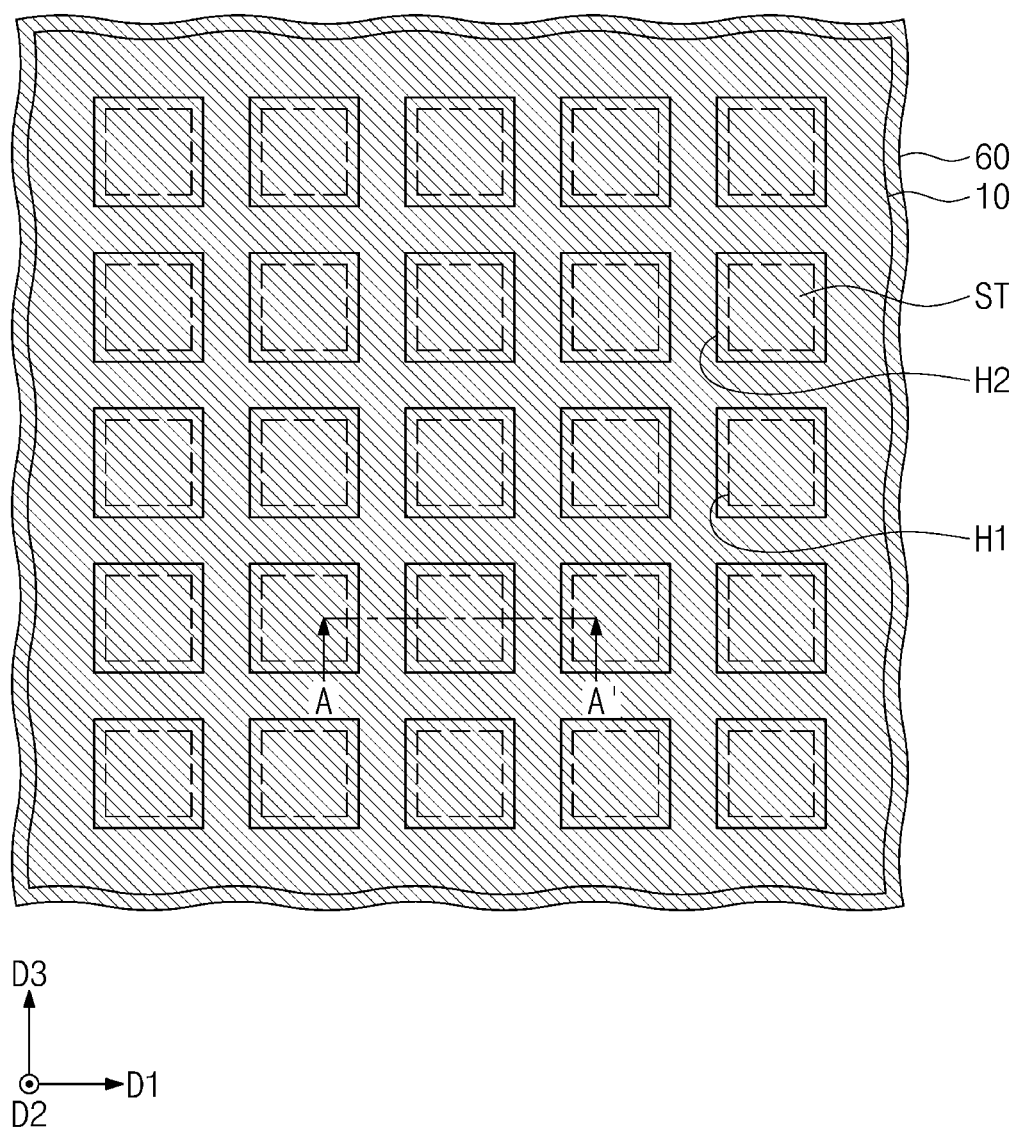
FIG. 1 is a plan view for explaining a memory device according to an embodiment of the inventive concept.

Advantages and features of the present invention, and implementation methods thereof will be clarified through following embodiments described with reference to the accompanying drawings. The present invention may, however, be embodied in many different forms and should not be construed as being limited to the embodiments set forth herein. Rather, these embodiments are provided so that this disclosure will be thorough and complete, and will fully convey the concept of the invention to those skilled in the art. Further, the present invention is only defined by scopes of claims. Like reference numerals refer to like elements throughout.

In the following description, the technical terms are used only for explaining a specific exemplary embodiment while not limiting the present disclosure. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Additionally, the embodiment in the detailed description will be described with sectional views as ideal exemplary views of the present invention. Also, in the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, an etched region having a right angle illustrated in the drawings may have a round shape or a shape having a predetermined curvature. Areas exemplified in the drawings have general properties, and are used to illustrate a specific shape of a semiconductor package region. Thus, this should not be construed as limited to the scope of the present invention.

Hereinafter, a memory device according to an embodiment of the inventive concept will be described in detail.

Figure 2:
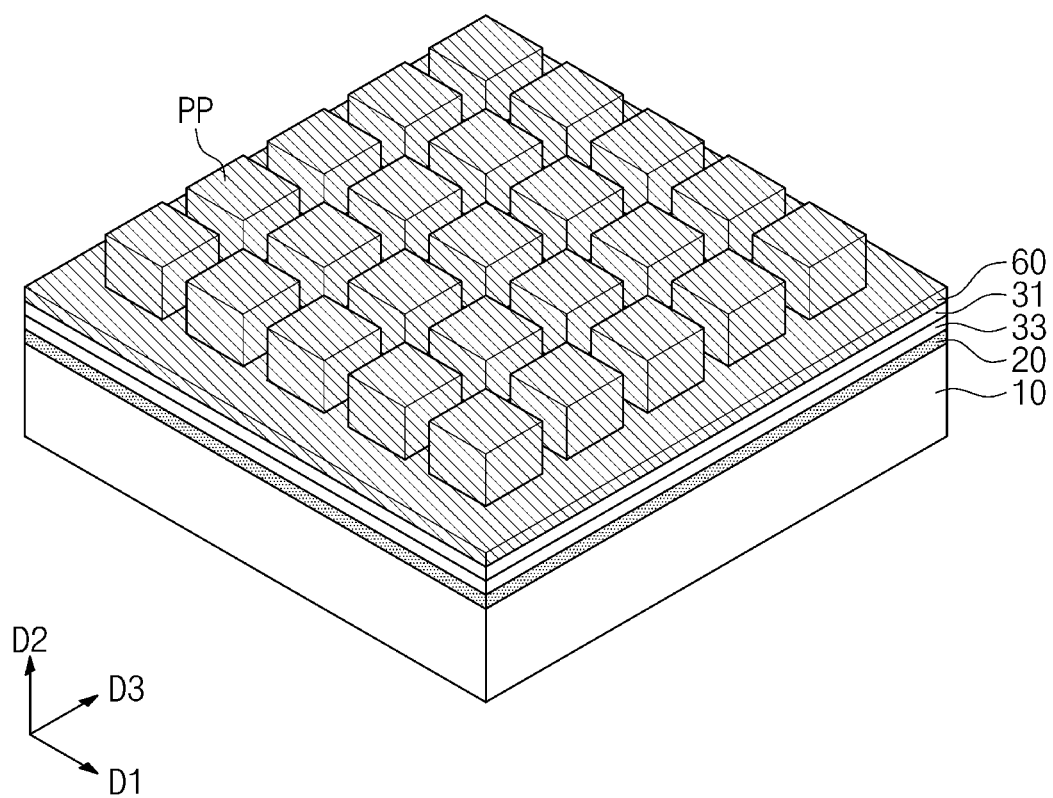
FIG. 2 is a perspective view for explaining the memory device in FIG. 1.

FIG. 1 is a plan view for explaining a memory device according to an embodiment of the inventive concept. FIG. 2 is a perspective view for explaining the memory device in FIG. 1. FIGS. 4A and 4B are cross-sectional views taken along line A-A' of FIGS. 1 and 3.

Referring to FIGS. 1, 4A, and 4B, the memory device according to an embodiment of the inventive concept may include a substrate 10, vertical structures ST disposed on the substrate 10, a first dielectric layer, and an upper electrode 60.

The substrate 10 may be provided. Although the substrate 10 may include a single crystal material or a combination thereof, the embodiment of the inventive concept is not limited thereto. For example, the substrate 10 may include $SrTiO_3$, $LaAlO_3$, YSZ, MgO, $Al_2O_3$, LSAT, quartz, GaN, SiC, SOI, or Si. A first direction D1 may be parallel to a top surface 10a of the substrate 10. A second direction D2 may be parallel to the top surface 10a of the substrate 10 and cross the first direction D1. A third direction D3 may be perpendicular to each of the first direction D1 and the second direction D2.

A common insulation layer 20 may be disposed on the substrate 10. The common insulation layer 20 may completely cover the top surface 10a of the substrate 10. The common insulation layer 20 may include an insulating material. For example, the common insulation layer 20 may include $CeO_2$, YSZ, $SiO_2$, $Al_2O_3$, $HfO_2$, or SiNx.

As illustrated in FIG. 4A, the memory device according to an embodiment of the inventive concept may further include a second dielectric layer 33. The second dielectric layer 33 may be provided on the common insulation layer 20. The second dielectric layer 33 may cover a top surface of the common insulation layer 20. The second dielectric layer 33 may extend between a bottom surface of the vertical structure ST and the substrate 10. The second dielectric layer 33 may include a ferroelectric material. For example, the ferroelectric material may include lead zirconate titanate (Pb(Zr1-yTiy)$O_3$), bismuth ferrite (BiFeO$_3$), lead titanate (PbTiO$_3$), hafnium oxide (HfO$_2$), or barium titanate (BaTiO$_3$). As in FIG. 4B, the second dielectric layer 33 may be omitted and not to be provided on the common insulation layer 20.

The vertical structures ST may be provided on the substrate 10. The vertical structures ST may be provided in plurality. The vertical structures ST may be aligned with each other in at least one direction of the first direction D1 and the second direction D2. In terms of a plane, although each of the vertical structures ST may have a rectangular shape, the embodiment of the inventive concept is not limited thereto. Hereinafter, the single vertical structure ST will be described for convenience of description.

The vertical structure ST may include insulation layers 40 and lower electrodes 50, which are alternately laminated with each other. The insulation layers 40 may include a first insulation layer 41, a second insulation layer 43, and a third insulation layer 45. The lower electrodes 50 may include a first lower electrode 51 and a second lower electrode 53.

The first insulation layer 41 may be disposed on the substrate 10. The first lower electrode 51 may be disposed on the first insulation layer 41. The second insulation layer 43 may be disposed on the first lower electrode 51. The second lower electrode 53 may be disposed on the second insulation layer 43. The third insulation layer 45 may be disposed on the second lower electrode 53. Each of the insulation layers 40 may include an insulating material. Each of the insulation layers 40 may include the same material as the common insulation layer 20. For example, each of the insulation layers 40 may include $CeO_2$, YSZ, $SiO_2$, $Al_2O_3$, $HfO_2$, and SiNx. Each of the lower electrodes 50 may include a conductive material. Each of the lower electrodes 50 may include conductive oxide or metal. For example, the metal may include Au, Pt, Pd, Ag, Cu, Ni, Cr, Ti, TiN, TaN, TiW, Co, and W, and the conductive oxide may include LSMO, LCMO, PCMO, SrRuO$_3$, LSCO, ITO, FTO, YBCO, RuO$_2$, and LaNiO$_3$.

The insulation layers 40 and the lower electrodes 50 may overlap each other in a vertical direction. Each of the insulation layers 40 may have a width in the first direction D1, which is equal to that in the first direction D1 of each of the lower electrodes 50. A side surface of each of the insulation layers 40 and a side surface of each of the lower electrodes 50 may be aligned with each other in the vertical direction. The vertical structure ST may have a top surface STa and a side surface STb. The side surface STb may include a first side surface STb1 and a second side surface STb2 facing the first side surface STb1. Each of the first side surface STb1 and the second side surface STb2 may include the side surfaces of the insulation layers 40 and the side surfaces of the lower electrodes 50. Unlike as illustrated, the insulation layers 40 may further include a plurality of insulation layers in addition to the first to third insulation layers 41, 43, and 45, and the lower electrodes 50 may further include a plurality of lower electrodes in addition to the first and second lower electrodes 51 and 53. Thus, a vertical height of the vertical structure ST may further increase.

The first dielectric layer 31 may be disposed on the substrate 10 and the vertical structure ST. The first dielectric layer 31 may be disposed between the upper electrode 60 and the vertical structure ST. More specifically, the first dielectric layer 31 may cover the top surface STa and the side surfaces STb of each of the plurality of vertical structures ST and may further cover a top surface of the second dielectric layer 33 (refer to FIG. 4A) exposed by the vertical structures ST or a top surface of the common insulation layer 20 (refer to FIG. 4B) exposed by the vertical structures ST. The first dielectric layer 31 may conformally cover the top surface STa and the side surfaces STb of each of the vertical structures ST. The first dielectric layer 31 may seal the vertical structures ST. Hereinafter, the single vertical structure ST will be described for convenience of description.

The first dielectric layer 31 may be disposed on the top surface STa, the first side surface STb1, and the second side surface STb2 of the vertical structure ST. The first dielectric layer 31 may extend from the top surface STa of the vertical structure ST onto the first side surface STb1 and the second side surface STb of the vertical structure ST and directly contact the first side surface STb1 and the second side surface STb2. The first dielectric layer 31 may include a ferroelectric material. The first dielectric layer 31 may include the same material as the second dielectric layer 33. For example, the first dielectric layer 31 may include lead zirconate titanate (Pb(Zr1-yTiy)O₃), bismuth ferrite (BiFeO₃), lead titanate (PbTiO₃), hafnium oxide (HfO₂), or barium titanate (BaTiO₃).

The upper electrode 60 may be disposed on the first dielectric layer 31. The upper electrode 60 may be disposed on the top surface STa and the side surfaces STb of the vertical structure ST. Thus, the first dielectric layer 31 may be disposed between the lower electrodes 50 and the upper electrode 60. The upper electrode 60 may conformally cover the first dielectric layer 31 along a top surface profile of the first dielectric layer 31. More specifically, the upper electrode 60 may include a first portion 61 disposed on the top surface STa of the vertical structure ST, a second portion 62 connected to the first portion 61 and disposed on the first side surface STb1 of the vertical structure ST, and a third portion 63 connected to the first portion 61 and disposed on the second side surface STb1 of the vertical structure ST. The second portion 62 may extend in parallel to the first side surface STb1 of the vertical structure ST. The second portion 62 may extend in parallel to the first side surface STb1 of the vertical structure ST. The third portion 63 may extend in parallel to the second side surface STb2 of the vertical structure ST. The first dielectric layer 31 may be disposed between the third portion 63 and the second side surface STb2 of the vertical structure ST. The upper electrode 60 may have a first recessed portion H2 defining protruding portions PP. Detailed features of the protruding portion PP will be described later in FIG. 2.

The upper electrode 60 may include a conductive material. The upper electrodes 60 may include conductive oxide or metal. For example, the metal may include Au, Pt, Pd, Ag, Cu, Ni, Cr, Ti, TiN, TaN, TiW, Co, and W, and the conductive oxide may include LSMO, LCMO, PCMO, SrRuO₃, LSCO, ITO, FTO, YBCO, RuO₂, and LaNiO₃. However, according to an embodiment of the inventive concept, the upper electrode 60 may include a material different from the lower electrodes 50. For example, when the upper electrode 60 includes one of Au, Pt, Pd, Ag, Cu, and Ni, each of the lower electrodes 50 may include one of Cr, Ti, TiN, TaN, TiW, Co, W, LSMO, LCMO, PCMO, SrRuO₃, LSCO, ITO, FTO, YBCO, RuO₂, and LaNiO₃. Thus, a metal positive ion may move by a degree of electrolytic dissociation between the upper electrode 60 and the lower electrodes 50.

Referring to FIG. 2 in conjunction with FIG. 4A, the memory device according to an embodiment of the inventive concept may include a plurality of protruding portions PP. Each of the protruding portions PP may be a portion defined by the first recessed portion H2 of the upper electrode 60 and protruding from a bottom surface of the first recessed portion H2 in the second direction D2. The protruding portions PP may be aligned and arranged in the first direction D1 and the second direction D2 on the substrate 10.

In the memory device according to an embodiment of the inventive concept, since the first dielectric layer 31 includes a ferroelectric material, a polarization direction of the first dielectric layer 31 may be changed according to a voltage applied to each of the upper electrode and the lower electrode. An ion movement velocity of the metal positive ion moving between the upper electrode 60 and the lower electrodes 50 through the first dielectric layer 31 may be changed according to the polarization direction of the first dielectric layer 31. Thus, the device may selectively operate by adjusting the polarization direction of the first dielectric layer 31. Also, according to an embodiment of the inventive concept, the vertical structures ST having the top surface STa, the first side surface STb1, and the second side surface STb2 may be provided, and the upper electrode 60 may cover the vertical structures ST. Thus, the first dielectric layer may be always disposed between the upper electrode 60 and the lower electrodes 50 in the vertical structures ST. As the vertical structures ST each including the plurality of lower electrodes 50 are provided on the substrate 10, an area in which the upper electrode 60 and the lower electrodes 50 face each other may increase. Thus, the further highly integrated memory device may be provided.

Another Embodiment of Electrode

Figure 3:
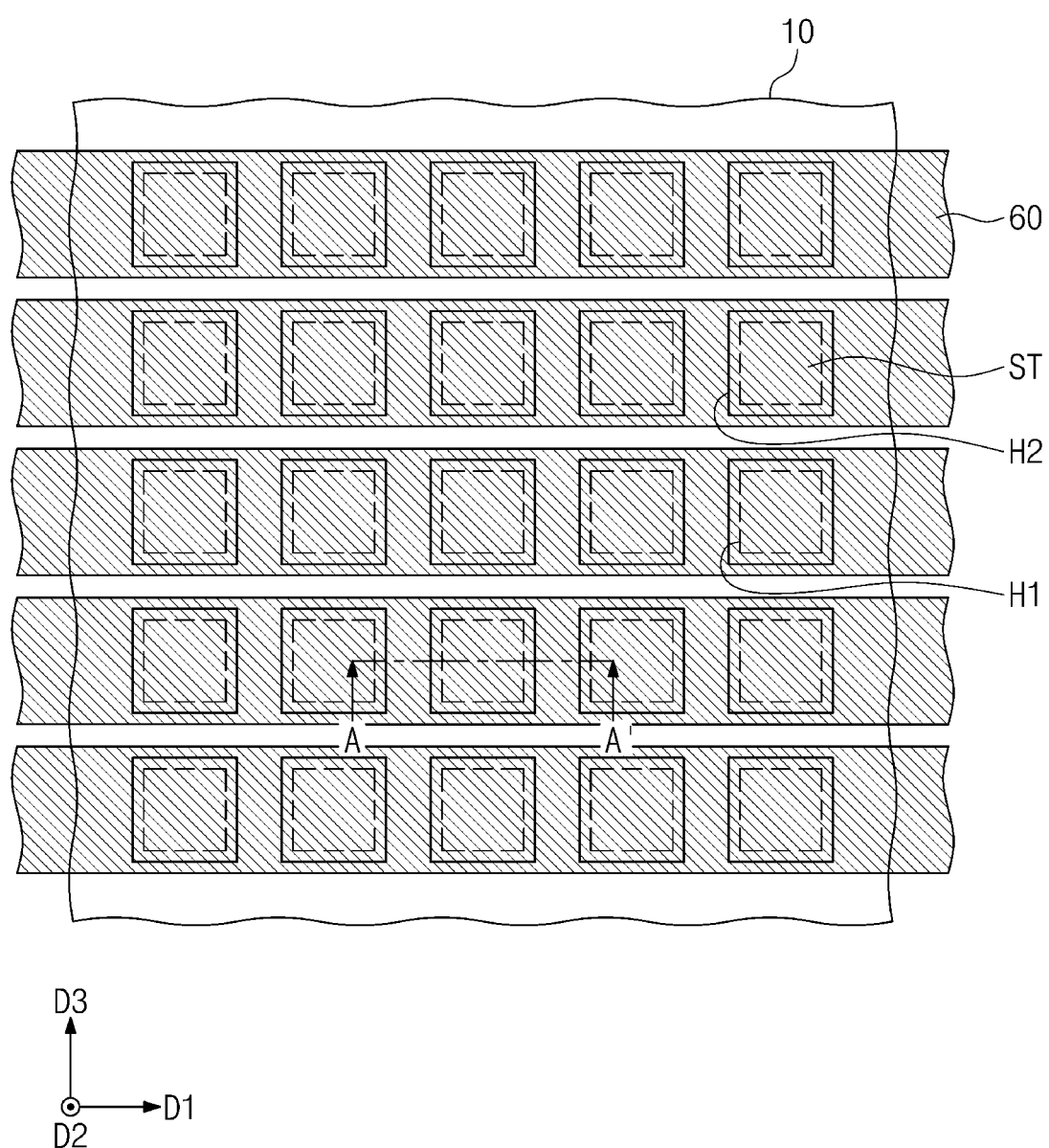
FIG. 3 is a plan view for explaining a memory device according to another embodiment of the inventive concept.
Figure 4A:
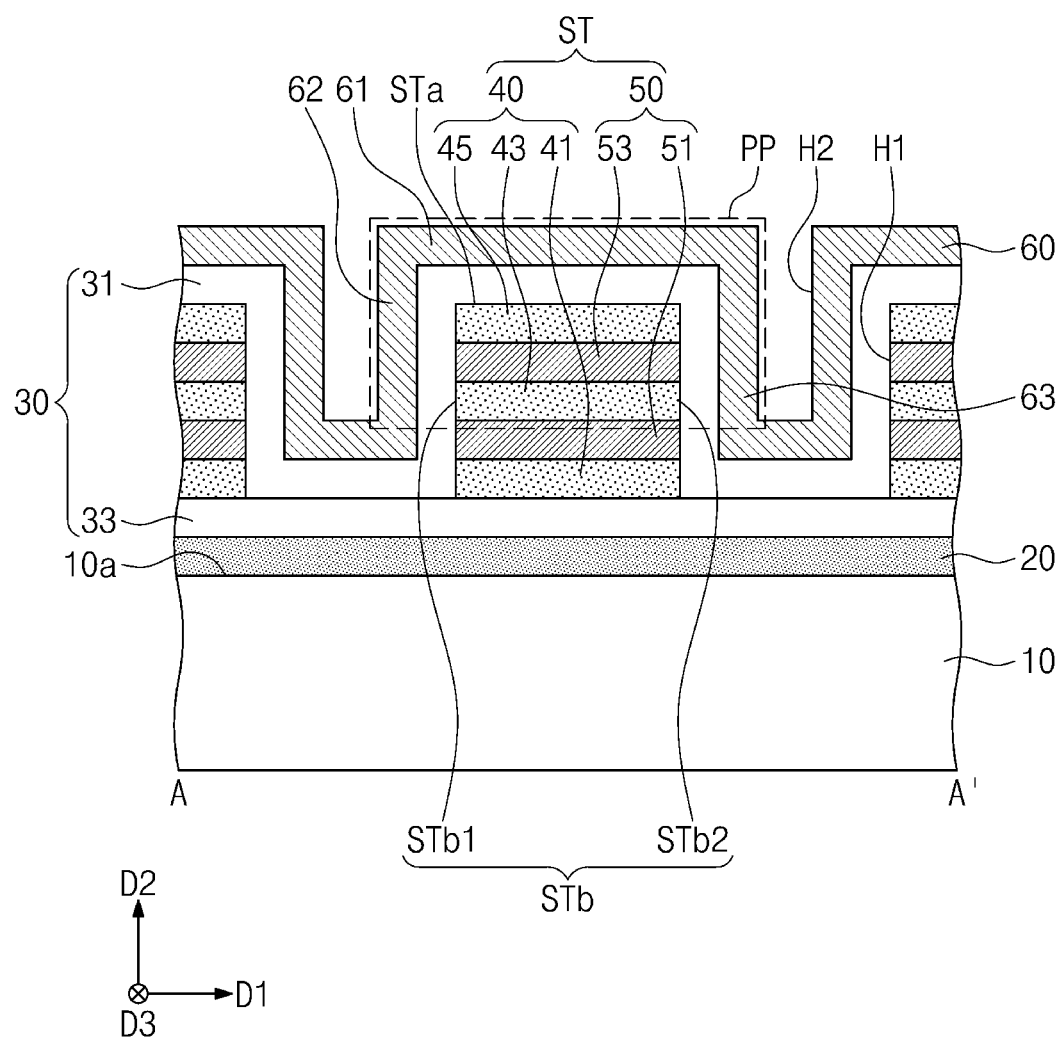
FIGS. 4A and 4B are cross-sectional views taken along line A-A' of FIGS. 1 and 3.
Figure 4B:
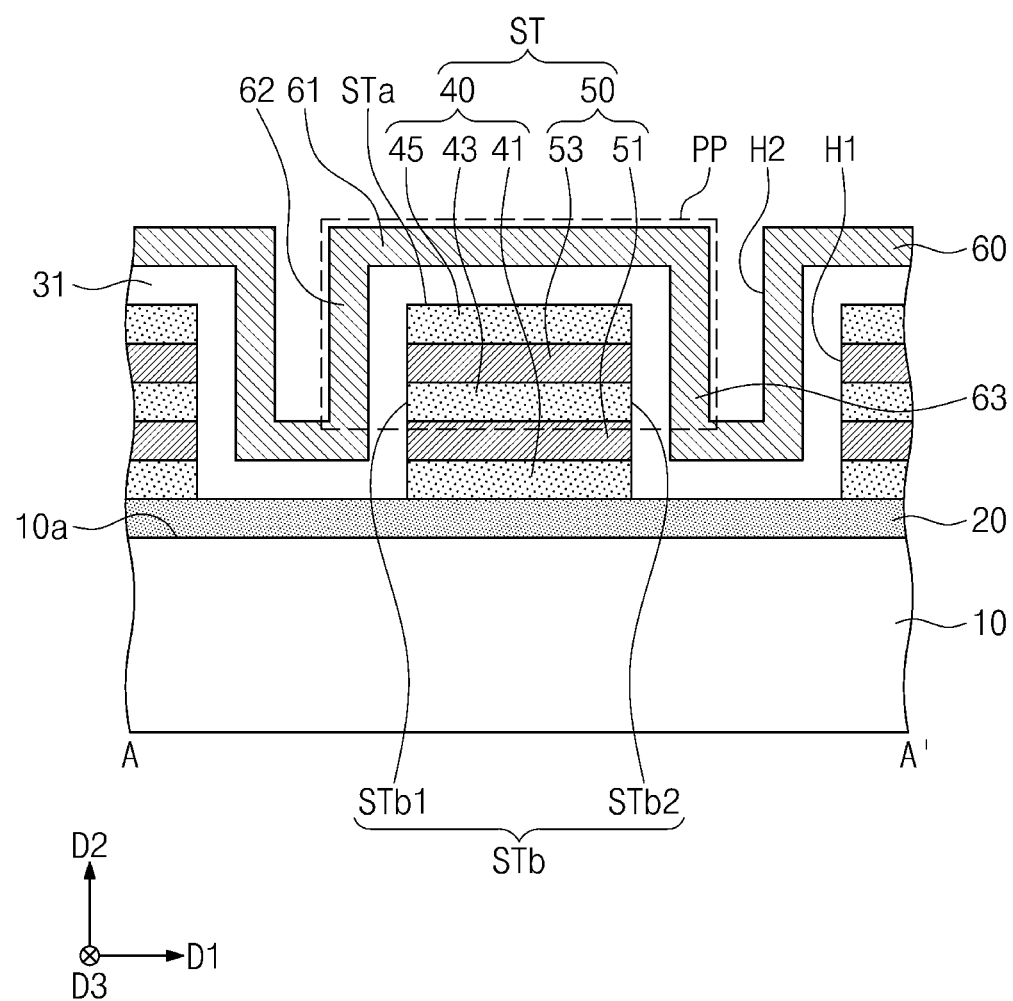

FIG. 3 is a plan view for explaining a memory device according to another embodiment of the inventive concept. Hereinafter, features overlapped with those described above will be omitted, and different points will be described in detail.

Referring to FIG. 3, the memory device according to another embodiment of the inventive concept may include a plurality of upper electrodes 60. The upper electrodes 60 may cover the plurality of vertical structures ST and each extend in the first direction D1. For example, although each of the upper electrodes 60 may have a line shape having a high aspect ratio in terms of a plane, the embodiment of the inventive concept is not limited thereto. For example, the shape of each of the upper electrodes 60 may be deformed. The vertical structures ST may be spaced apart from each other in the third direction D3. Different voltages may be applied to the upper electrodes 60, respectively. Thus, the memory device may be partially controlled by differently arranging the upper electrodes 60.

[Manufacturing Method]

FIGS. 5 to 10 are views for explaining a method of manufacturing a memory device according to an embodiment of the inventive concept.

Figure 5:
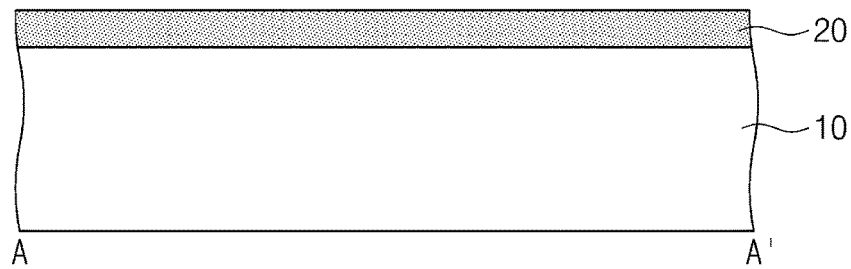
FIGS. 5 to 10 are views for explaining a method of manufacturing a memory device according to an embodiment of the inventive concept.
Figure 5:
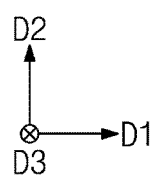

Referring to FIG. 5, a substrate 10 may be prepared. A polishing process may be performed on a top surface of the substrate 10. A common insulation layer 20 may be formed on the top surface of the substrate 10. The common insulation layer 20 may include, e.g., a silicon oxide layer or a silicon nitride layer. The common insulation layer 20 may be formed through a first deposition process. The first deposition process may be performed by using a thermal oxidation deposition method, a sputtering deposition method, or a chemical vapor deposition method.

Figure 6:
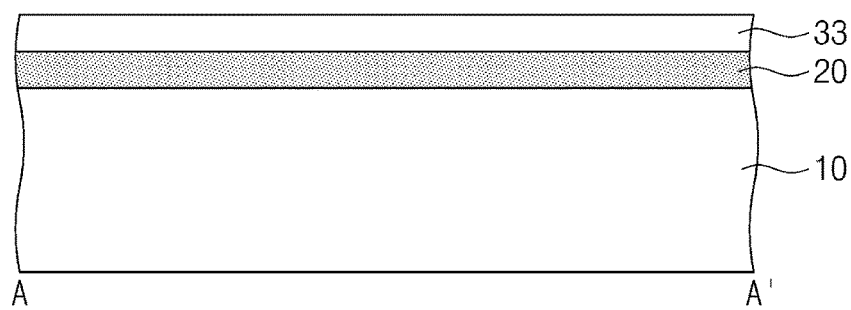
Figure 6:
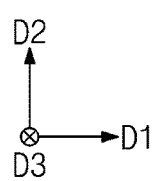

Referring to FIG. 6, a second dielectric layer 33 may be formed on a top surface of the common insulation layer 20. The second dielectric layer 33 may be formed on the top surface of the common insulation layer 20 by performing a second deposition process. The second deposition process may be performed by using a laser deposition method, a sputtering deposition method, a chemical vapor deposition method, or a molecular layer deposition method. Unlike as illustrated, the second deposition process may be omitted, and the second dielectric layer 33 may not be formed.

Figure 7:
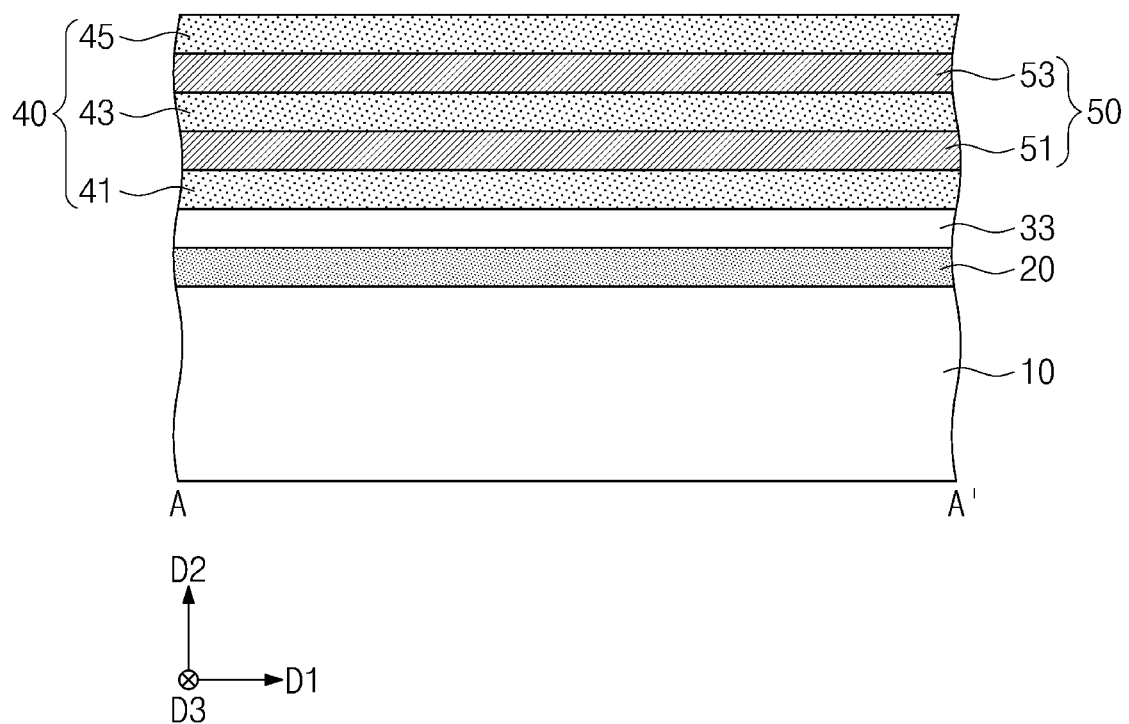

Referring to FIG. 7, multilayers 40 and 50 may be formed on the common insulation layer 20. The multilayers 40 and 50 may be formed by alternately depositing lower electrodes 50 and insulation layers 40. The insulation layers 40 may be formed by performing a deposition process using a thermal oxidation deposition method, a sputtering deposition method, or a chemical vapor deposition method, and the lower electrodes 50 may be formed by performing a deposition process using an electron beam deposition method, a thermal vapor method, a laser deposition method, a sputtering deposition method, a chemical vapor deposition method, or a molecular layer deposition method.

Figure 8:
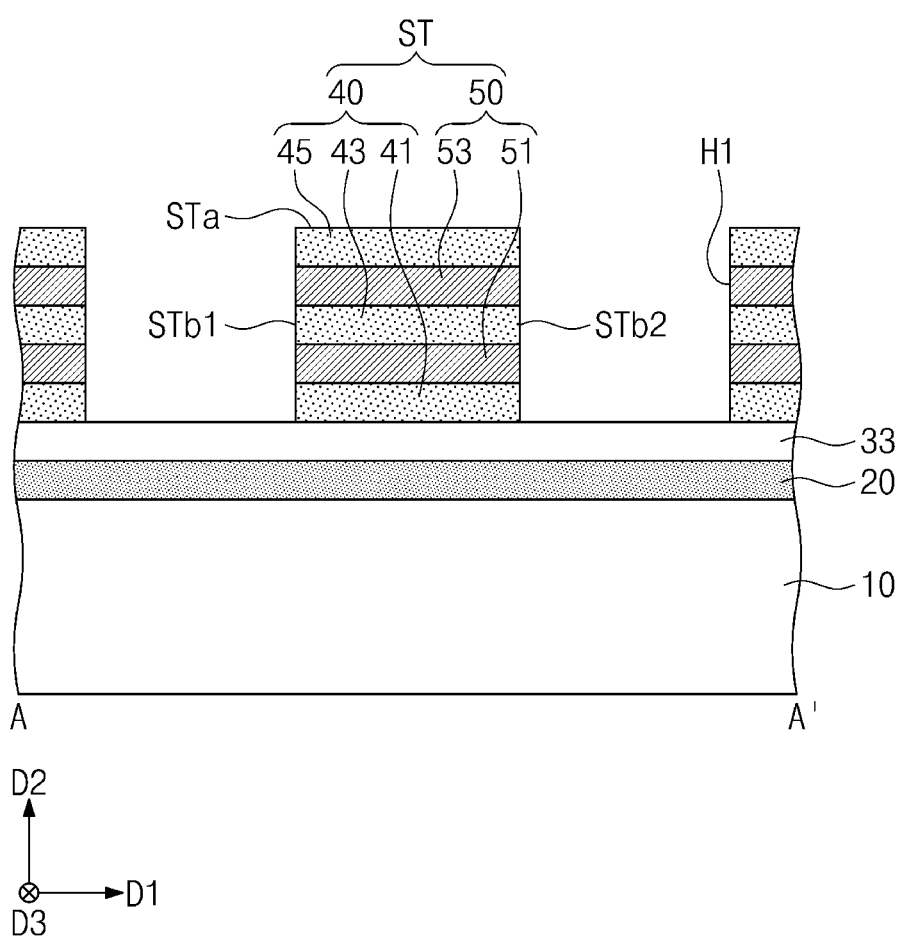

Referring to FIG. 8, vertical structures ST exposing a top surface of the second dielectric layer 33 may be formed by performing an etching process on the multilayers 40 and 50. As shown in FIG. 4B, when the second dielectric layer 33 is omitted, the vertical structures ST may expose the top surface of the common insulation layer 20. The etching process may include forming a first etched portion H1 by removing a portion of the multilayers 40 and 50. For example, the etching process may be performed until the top surface of the second dielectric layer 33 is exposed. The first etched portion H1 may define the vertical structures ST. The first etched portion H1 may expose a portion of the top surface of the second dielectric layer 33 to the outside. The first etched portion H1 may have an inside surface that is the same as a side surface of the vertical structures ST.

Figure 9:
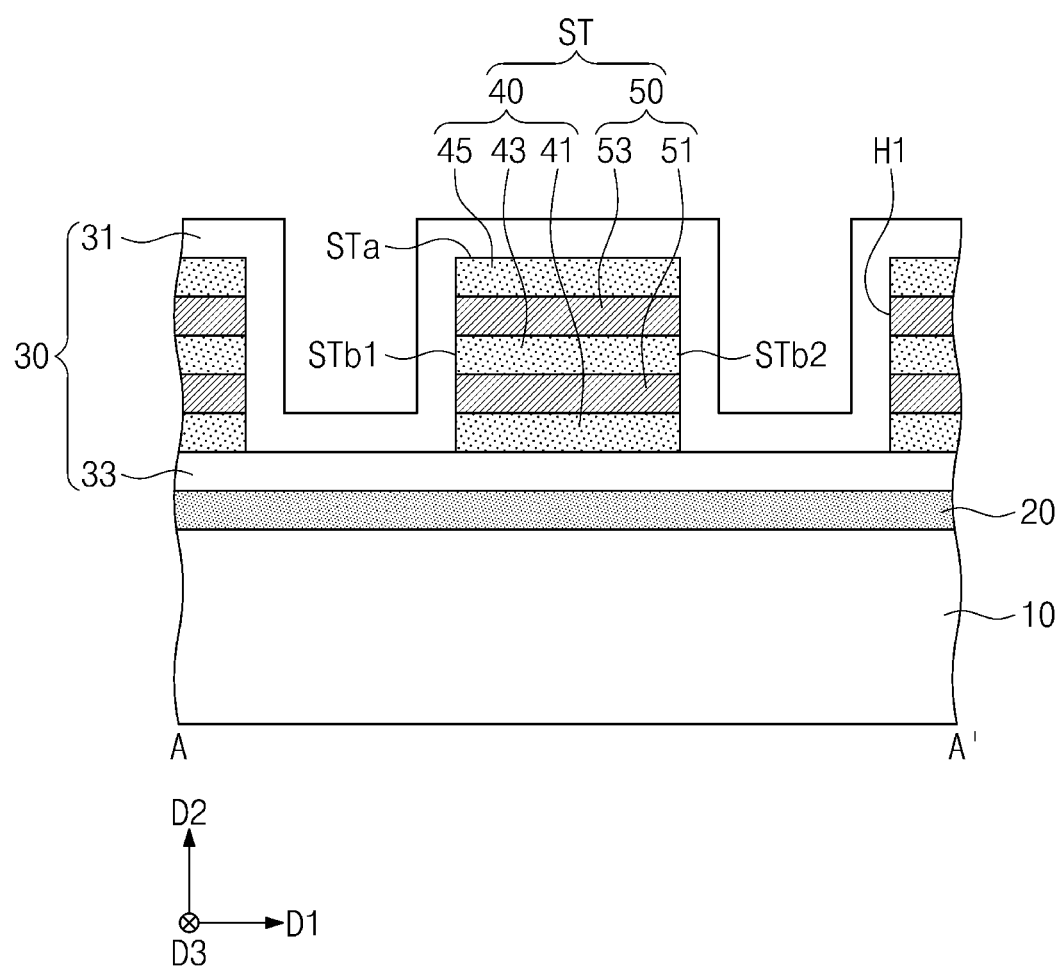

Referring to FIG. 9, a first dielectric layer 31 may be formed on the vertical structures ST and the top surface of the second dielectric layer 33, which is exposed by the vertical structures ST. The first dielectric layer 31 may be formed by performing a third deposition process on the vertical structures ST and the top surface of the second dielectric layer 33. The third deposition process may be performed by using a laser deposition method, a sputtering deposition method, a chemical vapor deposition method, or a molecular layer deposition method. The first dielectric layer 31 may be conformally formed on a top surface STa and side surfaces STb1 and STb2 of each of the vertical structures ST.

Figure 10:
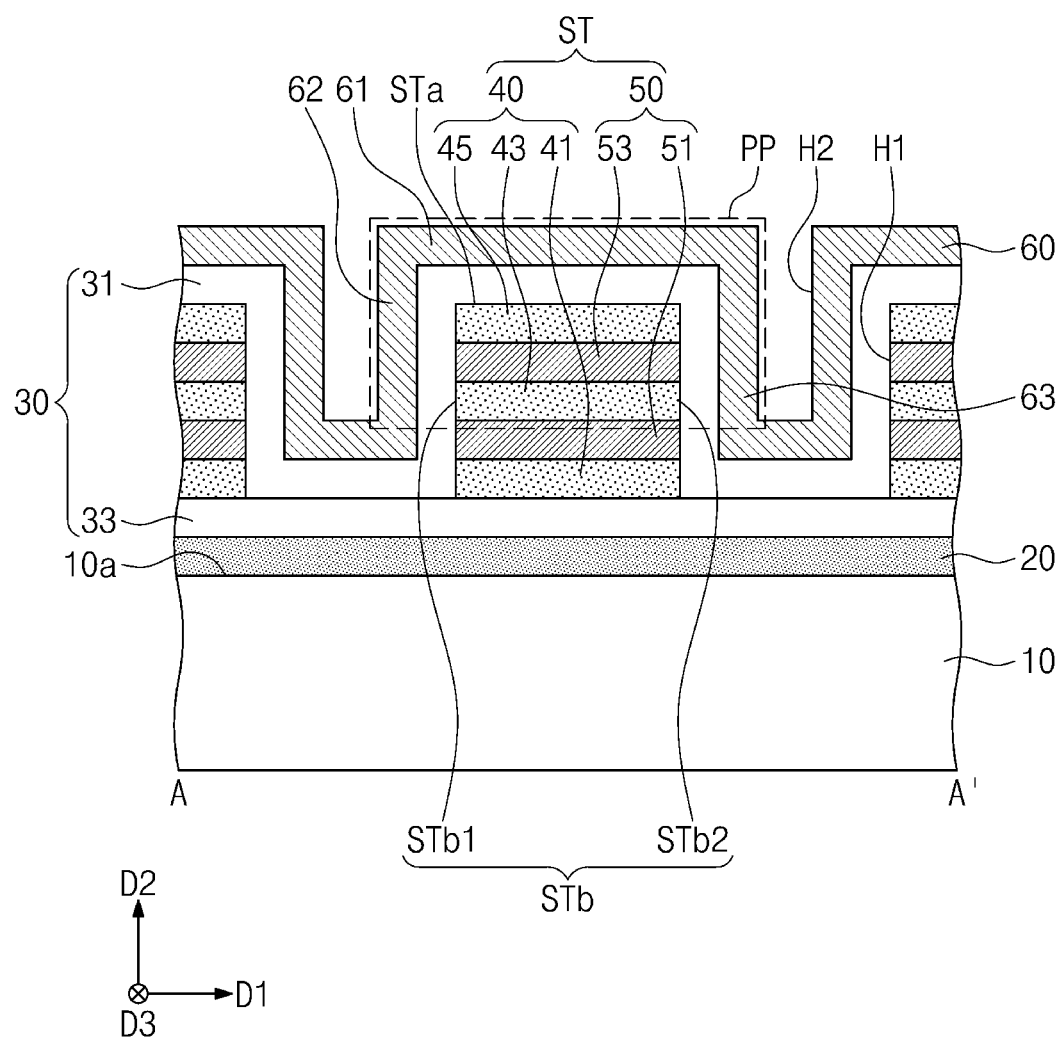

Referring to FIG. 10, an upper electrode 60 may be formed on the first dielectric layer 31. The upper electrode 60 may be deposited on the top surface of the first dielectric layer 31 along a top surface profile of the first dielectric layer 31. The upper electrode 60 may be formed by performing a fourth deposition process on the first dielectric layer 31. The fourth deposition process may be performed by using an electron beam deposition method, a thermal vapor method, a laser deposition method, a sputtering deposition method, a chemical vapor deposition method, or a molecular layer deposition method. The upper electrode 60 may be uniformly formed on the top surface STa and the side surfaces STb1 and STb2 of each of the vertical structures ST. After the upper electrode 60 is formed, a heat treatment process may be further performed. The memory device described in FIG. 4A may be manufactured through the above-described manufacturing method.

The memory device according to the embodiment of the inventive concept may include the vertical structures in which the lower electrodes and the insulation layers are alternately laminated with each other. As the upper electrode and the first dielectric layer including the ferroelectric material are disposed on the vertical structures, the function of the highly integrated memory device may be implemented.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A memory device comprising:
a substrate;
a plurality of vertical structures disposed on the substrate and comprising insulation layers and lower electrodes, which are alternately laminated with each other, wherein the vertical structures are aligned in a first direction parallel to a top surface of the substrate and a second direction crossing the first direction;
an upper electrode disposed on a top surface and side surfaces of each of the vertical structures; and
a first dielectric layer disposed between the upper electrode and the vertical structures to cover the top surface and the side surfaces of each of the vertical structures, wherein the first dielectric layer comprises a ferroelectric material.

2. The memory device of claim 1, wherein the side surfaces of each of the vertical structures comprises a first side surface and a second side surface facing the first side surface, and
the first dielectric layer extends from the top surface of each of the vertical structures onto the first side surface and the second side surface and contacts the first side surface and the second side surface.

3. The memory device of claim 2, wherein the upper electrode comprises a first portion disposed on the top surface of each of the vertical structures, a second portion connected to the first portion and disposed on the first side surface, and a third portion connected to the first portion and disposed on the second side surface, and the second portion and the third portion extend parallel to the first side surface and the second side surface, respectively.

4. The memory device of claim 1, wherein the ferroelectric material comprises lead zirconate titanate (Pb(Zr1-yTiy)O$_3$), bismuth ferrite (BiFeO$_3$), lead titanate (PbTiO$_3$), hafnium oxide (HfO$_2$), or barium titanate (BaTiO$_3$).

5. The memory device of claim 1, further comprising a second dielectric layer disposed on the substrate, wherein the second dielectric layer extends between a bottom surface of each of the vertical structures and the substrate.

6. The memory device of claim 5, wherein the top surface of each of the vertical structures is covered by the first dielectric layer, and the bottom surface of each of the vertical structures is covered by the second dielectric layer.

7. The memory device of claim 1, wherein the upper electrode comprises a material different from the lower electrode.

8. The memory device of claim 7, wherein each of the upper electrode and the lower electrodes comprises conductive oxide or metal.

9. The memory device of claim 1, wherein the vertical structure has a rectangular shape in terms of a plane.

10. The memory device of claim 1, wherein the upper electrode covers the first dielectric layer, wherein the upper electrode comprises recessed portions configured to define protruding portions on the substrate.

11. A method of manufacturing a memory device, comprising:

forming a common insulation layer and a first dielectric layer on a substrate in sequence;

forming lower electrodes and insulation layers, which are alternately laminated on a top surface of the first dielectric layer;

forming vertical structures configured to expose the top surface of the first dielectric layer by performing an etching process on the lower electrodes and the insulation layers;

forming a second dielectric layer configured to cover side surfaces of the vertical structures and the top surface of the first dielectric layer; and depositing an upper electrode on a top surface of the second dielectric layer along a top surface profile of the second dielectric layer, wherein the first dielectric layer comprises a ferroelectric material.

12. The method of claim 11, wherein each of the lower electrodes comprises one of Cr, Ti, TiN, TaN, TiW, Co, W, LSMO, LCMO, PCMO, SrRuO$_3$, LSCO, ITO, FTO, YBCO, RuO$_2$, and LaNiO$_3$, and the upper electrode comprises one of Au, Pt, Pd, Ag, Cu, and Ni.

13. The method of claim 11, wherein the forming of the vertical structures comprises forming a first etched portion by removing a portion of each of the insulation layers and the lower electrodes, the etching process is performed until the top surface of the first dielectric layer is exposed, and the first etched portion defines the vertical structures.

14. The method of claim 11, wherein the depositing of the upper electrode on the top surface of the second dielectric layer along the top surface profile of the second dielectric layer is performed by using an electron beam deposition method, a thermal vapor method, a laser deposition method, a sputtering deposition method, a chemical vapor deposition method, or a molecular layer deposition method.

15. The method of claim 11, wherein the ferroelectric material comprises lead zirconate titanate (Pb(Zr1-yTiy)O$_3$), bismuth ferrite (BiFeO$_3$), lead titanate (PbTiO$_3$), hafnium oxide (HfO$_2$), or barium titanate (BaTiO$_3$).

16. The method of claim 11, further comprising performing a heat treatment process on the upper electrode after the depositing of the upper electrode.

* * * * *